(12) United States Patent
Farhadzadeh et al.

(10) Patent No.: US 10,794,693 B2
(45) Date of Patent: Oct. 6, 2020

(54) METROLOGY METHOD, APPARATUS AND COMPUTER PROGRAM

(71) Applicant: ASML Netherlands B.V., Veldhoven (NL)

(72) Inventors: Farzad Farhadzadeh, Eindhoven (NL); Mohammadreza Hajiahmadi, Rotterdam (NL); Maurits Van Der Schaar, Eindhoven (NL); Murat Bozkurt, Uden (NL)

(73) Assignee: ASML Netherlands B.V., Veldhoven (NL)

( * ) Notice: Subject to any disclaimer, the term of this patent is extended or adjusted under 35 U.S.C. 154(b) by 144 days.

(21) Appl. No.: 16/102,145

(22) Filed: Aug. 13, 2018

(65) Prior Publication Data

US 2019/0056220 A1 Feb. 21, 2019

(30) Foreign Application Priority Data

Aug. 15, 2017 (EP) ...................... 17186295

(51) Int. Cl.
*G01B 11/27* (2006.01)
*G03F 7/20* (2006.01)

(52) U.S. Cl.
CPC ............ *G01B 11/272* (2013.01); *G03F 7/705* (2013.01); *G03F 7/70633* (2013.01); *G01B 2210/56* (2013.01)

(58) Field of Classification Search
CPC ... G01B 11/272; G01B 2210/56; G03F 7/705; G03F 7/70633

(Continued)

(56) References Cited

U.S. PATENT DOCUMENTS 6,317,203 B1 * 11/2001 Wakabayashi ......... G01M 11/00
356/237.1
2011/0027704 A1 2/2011 Cramer et al.
(Continued)

FOREIGN PATENT DOCUMENTS

EP 3 293 574 A1 3/2018
WO WO 2009/078708 A1 6/2009
(Continued)

OTHER PUBLICATIONS

Dettoni et al., "Enhanced 28 nm FD-SOI Diffraction Based Overlay metrology based on Holistic Metrology Qualification," Metrology, Inspection, and Process Control for Microlithography XXXI, Proceedings of SPIE, vol. 10145, 2017; pp. B1-B11.

(Continued)

*Primary Examiner* — Tri T Ton
(74) *Attorney, Agent, or Firm* — Sterne, Kessler, Goldstein & Fox P.L.L.C.

(57) ABSTRACT

Disclosed is a method and associated apparatus of determining a performance parameter (e.g., overlay) of a target on a substrate, and an associated metrology apparatus. The method comprises estimating a set of narrowband measurement values from a set of wideband measurement values relating to the target and determining the performance parameter from said set of narrowband measurement values. The wideband measurement values relate to measurements of the target performed using wideband measurement radiation and may correspond to different central wavelengths. The narrowband measurement values may comprise an estimate of the measurement values which would be obtained from measurement of the target using narrowband measurement radiation having a bandwidth narrower than said wideband measurement radiation.

12 Claims, 6 Drawing Sheets

(58) Field of Classification Search
USPC .................................................. 356/600–640
See application file for complete search history.

(56) References Cited

U.S. PATENT DOCUMENTS

| | | |
|---|---|---|
| 2011/0043791 A1 | 2/2011 | Smilde et al. |
| 2012/0242970 A1 | 9/2012 | Smilde et al. |
| 2018/0087900 A1* | 3/2018 | Paskover ............ G01N 21/6489 |
| 2019/0145754 A1* | 5/2019 | Liu .................... G01B 9/02009 |
| | | 356/497 |

FOREIGN PATENT DOCUMENTS

| | | |
|---|---|---|
| WO | WO 2009/106279 A1 | 9/2009 |
| WO | WO 2011/012624 A1 | 2/2011 |

OTHER PUBLICATIONS

Bhattacharyya et al., "A study of swing-curve physics in diffraction-based overlay,", Metrology, Inspection, and Process Control for Microlithography XXX, Proceedings of SPIE, vol. 9778, 2016; pp. 1-6.

Zhou et al., "Reducing the Overlay Metrology Sensitivity to Perturbations of the Measurement Stack," Metrology, Inspection, and Process Control for Microlithography XXXI, Proceedings of SPIE, vol. 10145, 2017; pp. G1-G12.

International Search Report and Written Opinion of the International Searching Authority directed to related International Patent Application No. PCT/EP2018/070728, dated Oct. 18, 2018; 14 pages.

* cited by examiner

METROLOGY METHOD, APPARATUS AND COMPUTER PROGRAM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay (undesired misalignment of two layers).

When measuring thick stacks, where there may be a significant distance between the two layers being measured. This can make determination of a performance parameter such as overlay unreliable because stack sensitivity for such thick stack targets tends to oscillate rapidly as a function of wavelength. Additionally, some metrology apparatuses are presently unable to produce narrowband measurement radiation having a bandwidth significantly narrower than the period of this oscillation. The finite bandwidth of the measurement radiation produced by such apparatuses tends to average out the stack sensitivity to a very low value, leading to very inaccurate measurements. While it may be possible to develop metrology devices with a narrowband source sometime in the future, for various technical and/or commercial reasons it is not straightforward to change the specification of such apparatuses in the short to medium term, at least.

SUMMARY OF THE INVENTION

It would be desirable to be able to perform overlay metrology on thick stacks with improved accuracy, and in particular to be able to do so while using existing metrology hardware.

The invention in a first aspect provides a method of determining a performance parameter of a target on a substrate comprising: estimating a set of narrowband measurement values from a set of wideband measurement values relating to the target; and determining said performance parameter from said set of narrowband measurement values.

The invention in a second aspect provides a metrology apparatus comprising: an illumination system configured to illuminate a target with wideband measurement radiation having a finite bandwidth; a detection system configured to detect scattered radiation arising from illumination of the target; and a processor operable to: a processor operable to: control said illumination system and detection system to perform a plurality of measurements of the target using the wideband measurement radiation to obtain a set of wideband measurement values relating to the target; estimate a set of narrowband measurement values from said wideband measurement values; and determine said performance parameter from said set of narrowband measurement values.

The invention further provides a computer program comprising processor readable instructions which, when run on suitable processor controlled apparatus, cause the processor controlled apparatus to perform the method of the first aspect, and a computer program carrier comprising such a computer program.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
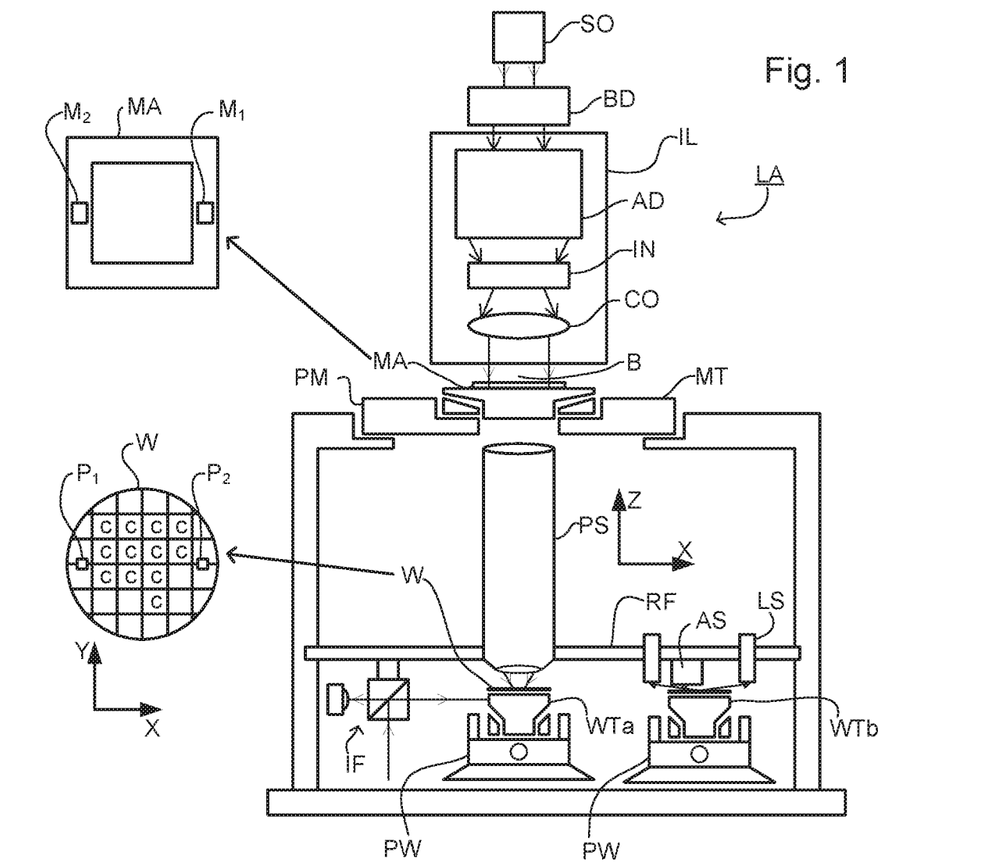
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
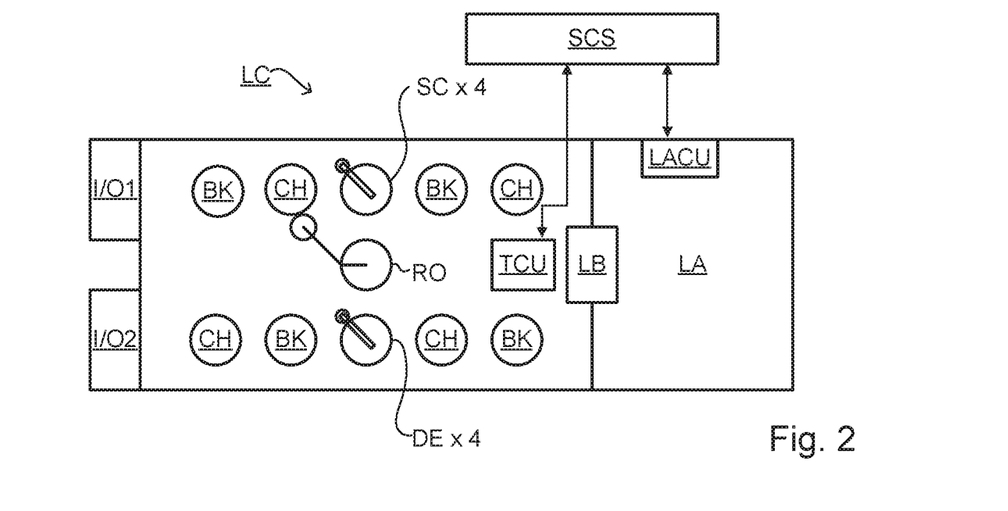
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figures 3A, 3B, 3C, 3D:
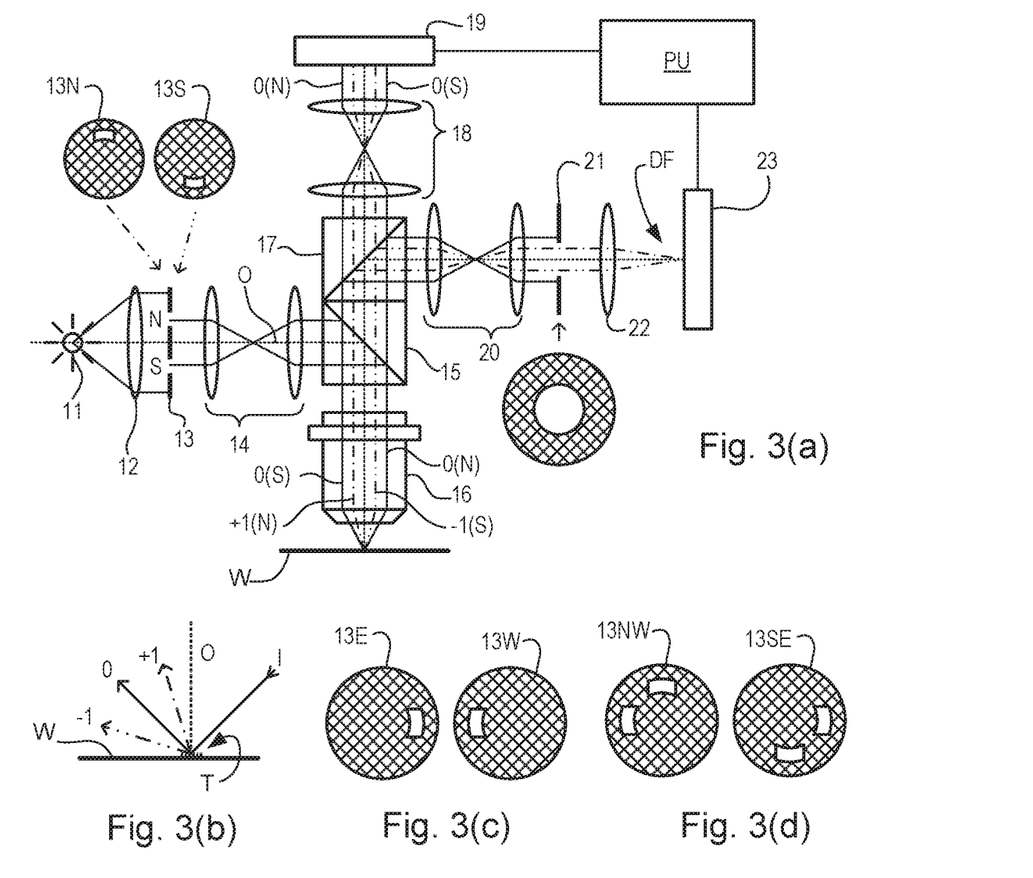
FIGS. 3(a)-3(d) comprises 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4 F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, with optical wedges (or other suitable elements) in the detection branch to separate the orders for imaging. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
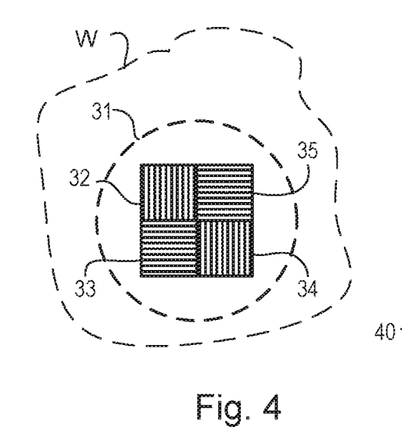
FIG. 4 depicts a known form of multiple grating target and an outline of a measurement spot on a substrate.

FIG. 4 depicts an overlay target or composite overlay target formed on a substrate according to known practice. The overlay target in this example comprises four sub-overlay targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

Figure 5:
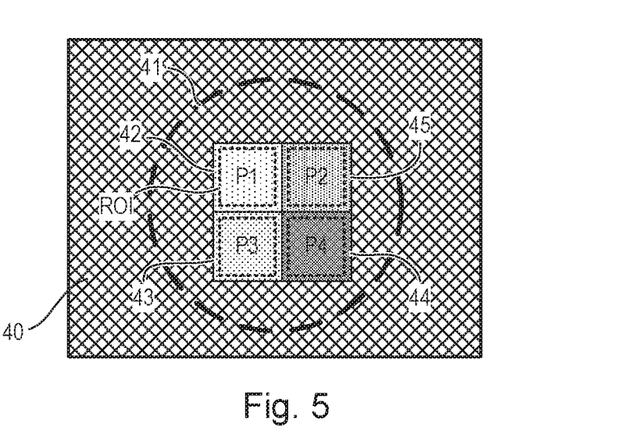
FIG. 5 depicts an image of the target of FIG. 4 obtained in the scatterometer of FIGS. 3(a)-3(d)

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
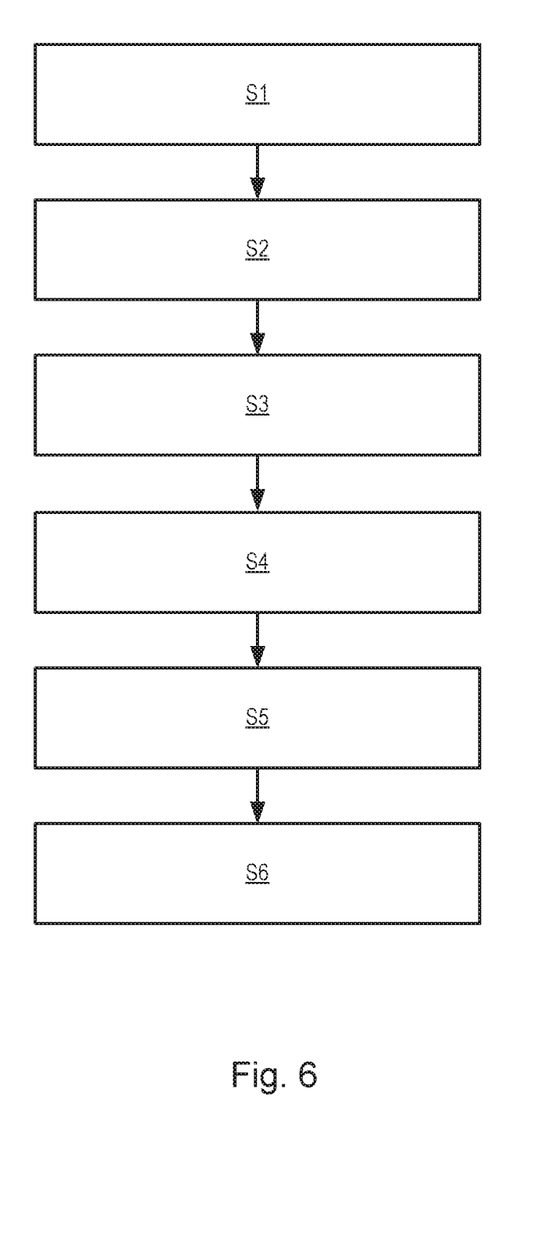
FIG. 6 is a flowchart showing the steps of an overlay measurement method using the scatterometer of FIGS. 3(a)-3(d)

FIG. 6 illustrates how, using for example the method described in application WO 2011/012624, overlay (i.e., undesired and unintentional lateral displacement) between the two layers containing the sub-targets 32 to 35 is measured. Such a method may be referred to as micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create an overlay target including the sub-targets 32-35. At S2, using the metrology apparatus of FIG. 3, an image of the sub-targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the overlay targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level. In step S4, a region of interest (ROI) is identified within the image of each component overlay target, from which intensity levels will be measured.

Having identified the ROI for each individual overlay target and measured its intensity, the asymmetry of the overlay target, and hence overlay error, can then be determined. This is done (e.g., by the processor PU) in step S5 comparing the intensity values obtained for +1 and −1 orders for each sub-target 32-35 to identify their intensity asymmetry, e.g., any difference in their intensity. The term "difference" is not intended to refer only to subtraction. Differences may be calculated in ratio form. In step S6 the measured intensity asymmetries for a number of overlay targets are used, together with knowledge of any known imposed overlay biases of those overlay targets, to calculate one or more performance parameters of the lithographic process in the vicinity of the overlay target T. A performance parameter of great interest is overlay.

Figure 7:
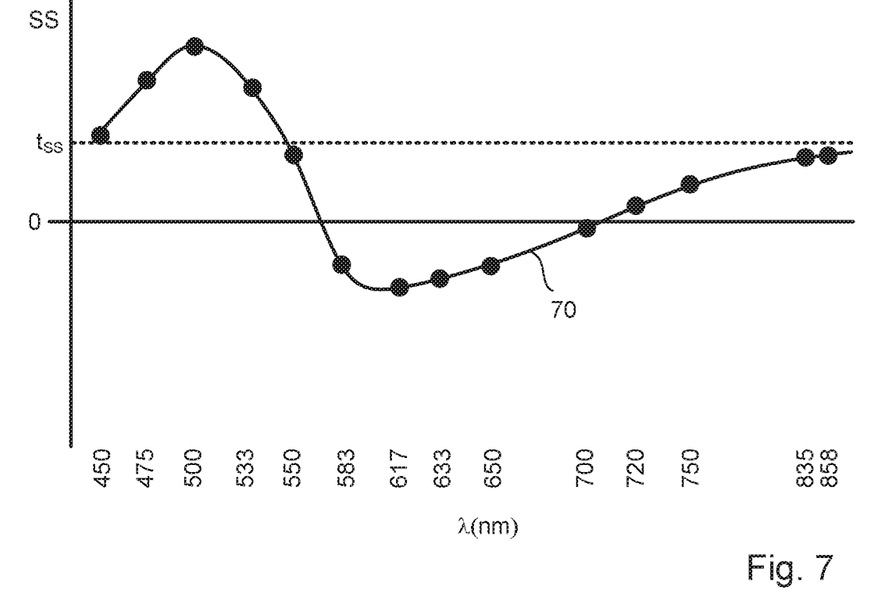
FIG. 7 shows an exemplary swing curve plot of stack sensitivity against wavelength for a thin stack target.

FIG. 7 shows an exemplary swing curve 70 of stack sensitivity SS against wavelength λ for a conventional, relatively thin stack. Stack sensitivity describes the change in asymmetry signal between the sub-targets, normalized by the average of their intensity scaled by a constant $$\frac{C}{2d}.$$

In a specific example (other formulations are possible), stack sensitivity SS may be described by:

$$SS = \frac{(A_{+d} - A_{-d})}{I_{av}} \times \frac{C}{2d} \quad \text{(Equation 1)}$$

where +d and −d are the imposed sub-target biases (having magnitude d), C is a constant (distance) which normalizes this bias, $A_{+d}$ is an asymmetry measurement (intensity difference $I_{+d}^{+1} - I_{+d}^{-1}$) of normal $I_{+d}^{+1}$ and complementary $I_{+d}^{-1}$ intensities of the +d sub-target ($=I_{+d}^{+1} - I_{+d}^{-1}$) and $A_{-d}$ is an asymmetry measurement (intensity difference $I_{-d}^{+1} - I_{-d}^{-1}$) of normal $I_{-d}^{+1}$ and complementary $I_{-d}^{-1}$ intensities of the −d sub-target. $I_{av}$ is the average of the intensity measurements of both sub-targets +d, −d, for both the +1 and −1 diffraction orders; i.e., $I_{av} = (I_{+d}^{+1} + I_{+d}^{-1} + I_{-d}^{+1} + I_{-d}^{-1})/4$. It can be seen from this equation the higher the intensity asymmetry the higher the stack sensitivity.

Using this swing curve 70, wavelengths may be chosen to maximize the stack sensitivity, i.e., in this specific example, the 500 nm wavelengths and one of 475 nm or 533 nm may be preferred for measurements. One or more other criteria may also be taken into account when selecting the wavelengths, and as such it is possible that the 475 nm and 533 nm wavelengths, or other wavelengths which show relatively high stack sensitivity, may be preferred, for example. However, wavelengths with very little or no stack sensitivity (e.g., 700 nm or 720 nm) should be avoided. Therefore, a stack sensitivity threshold $t_{ss}$ may be set, and only those wavelengths for which stack sensitivity is above this threshold $t_{ss}$ considered for performing actual measurements.

Figure 8:
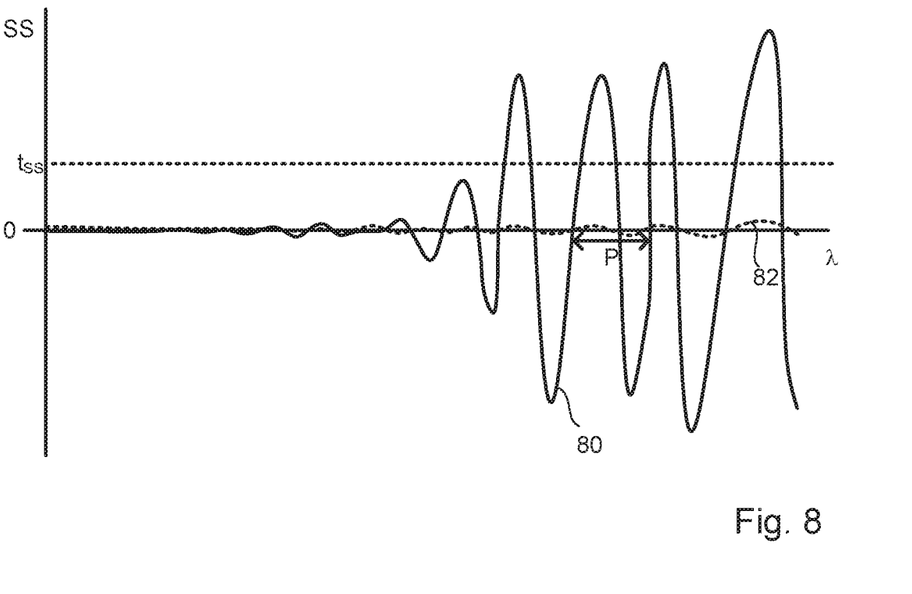
FIG. 8 shows an exemplary simulated swing curve plot of stack sensitivity against wavelength for a thick stack target, and a corresponding measured swing curve plot for the thick stack target obtained from actual measurements performed using wideband measurement radiation.

Measurement of (e.g., overlay) targets using diffractive metrology methods such as those described above is more accurate for such thinner stacks, where the distance (in the z-direction perpendicular to the substrate plane) between the two layers being measured is not too large. However, measurement of thicker stacks presents greater difficulty. A thick stack target may comprise, for example, a target having gratings in two layers, separated by a large distance (e.g., for an ADI or after develop inspection target). Thick stack targets may also comprise so-called AEI (after etch inspection) or ACI (after clean inspection) targets. An AEI target is a target for which, after the step of exposing the upper grating, the layer(s) below are etched into (before inspection). An ACI target is similar but with the photo stack (resist/barc/darc/hard mask etc.) also removed before inspection. In such targets, the bottom of the top target is actually very close to the top of the bottom target. However, the stack thickness is still large. A large thickness may be a thickness which is large with respect to the wavelength of the measurement radiation. More specifically, a large thickness may be a thickness greater than 1 μm, or greater than 3 μm. In particular, stack sensitivity of such thick stacks may be observed to oscillate rapidly as a function of wavelength. This is illustrated in FIG. 8, which shows a similar swing curve plot as that of FIG. 7, but for a thick stack target. The solid line comprises a simulated swing curve 80 for the thick stack target. The period P of the oscillation is between about 10-24 nm, and therefore the width of each peak is about 5-12 nm.

Because of this oscillation, measurements should be performed using sufficiently narrowband radiation of a wavelength centered, for example, on or near one of the peaks (positive or negative) of the swing curve 80, or at least at a point on the swing curve where stack sensitivity is not too low. However, while some metrology apparatuses may provide for the wavelength of the measurement radiation to be freely selectable, a limitation of some such apparatuses is that they cannot produce sufficiently narrowband measurement radiation. Instead the bandwidth of the measurement radiation produced by such metrology apparatuses tends to be in the region of 10 nm or more, comparable in size to the peak widths of the swing curve 80. This finite bandwidth tends to average out the stack sensitivity to a very low value, as indicated by the swing curve 82 (dotted line). This swing curve 82 is an actual measured swing curve of the same thick stack target as that of the simulated swing curve 80. The only difference between the swing curve 82 and swing curve 80 is that the bandwidth of the measurement radiation used to measure the target to obtain swing curve 82 is finite (of the order of about 10 nm, for example), while the simulated swing curve 80 shows the measurement response from simulated narrowband (e.g., zero bandwidth) measurements of the target with respect to the oscillation period. It can be seen that from the averaged swing curve 82, that the stack sensitivity SS which is actually observed when using wideband measurement radiation is well below the threshold $t_{ss}$ over the entire wavelength range (barely straying from zero), and therefore any measurements made with such wideband measurement radiation will be unreliable.

Methods will now be described which enable reliable measurement of such thick stack targets using wideband measurement radiation, thereby enabling use of present metrology apparatuses which are only capable of producing such wideband radiation. The methods comprise estimating narrowband measurement values for a measurement parameter of the target from detected wideband measurement values. A wideband measurement value in this context is a measurement value of a target parameter corresponding to (e.g., obtained from) a measurement performed using wideband radiation. An estimated narrowband measurement value is an estimate of the value of a measurement parameter corresponding to a measurement performed using narrowband radiation; e.g., measurement values which would have been obtained had the measurement radiation been narrowband. The measurement parameter may be intensity, for example.

"Wideband" and "narrowband" in the context of this disclosure are defined with reference to the other, and as such "narrowband" describes a bandwidth which is narrower than that of "wideband" radiation. In an embodiment, "wideband" radiation may be the measurement radiation actually used to perform measurements; e.g., radiation actually output from a metrology apparatus. Alternatively, or in addition, wideband radiation may be radiation having a bandwidth insufficiently narrow to capture details of the swing curve; e.g., radiation having a bandwidth of comparable magnitude to the period of oscillation of a swing curve (stack sensitivity versus wavelength) corresponding to the use of narrowband radiation. By way of specific examples, wideband radiation may comprise radiation with a bandwidth greater than 2 nm, greater than 3 nm; greater than 5 nm or greater than 10 nm. Similarly, by way of specific examples, narrowband radiation may comprise radiation with a bandwidth narrower than 10 nm, narrower than 5 nm, narrower than 1 nm, narrower than 0.5 nm, narrower than 0.1 nm or zero bandwidth, provided that it is narrower than the bandwidth of the wideband radiation.

The method comprises modeling a wideband measurement value relating to measurement of a target using wideband measurement radiation as a linear combination of a plurality of narrowband measurement values over a range defined by the bandwidth of the wideband measurement radiation. As such the method comprises estimating a plurality of equivalent narrowband measurement values (e.g., narrowband intensity signals), as output from the optical system of the measurement apparatus, from detected wideband measurement values.

Figure 9:
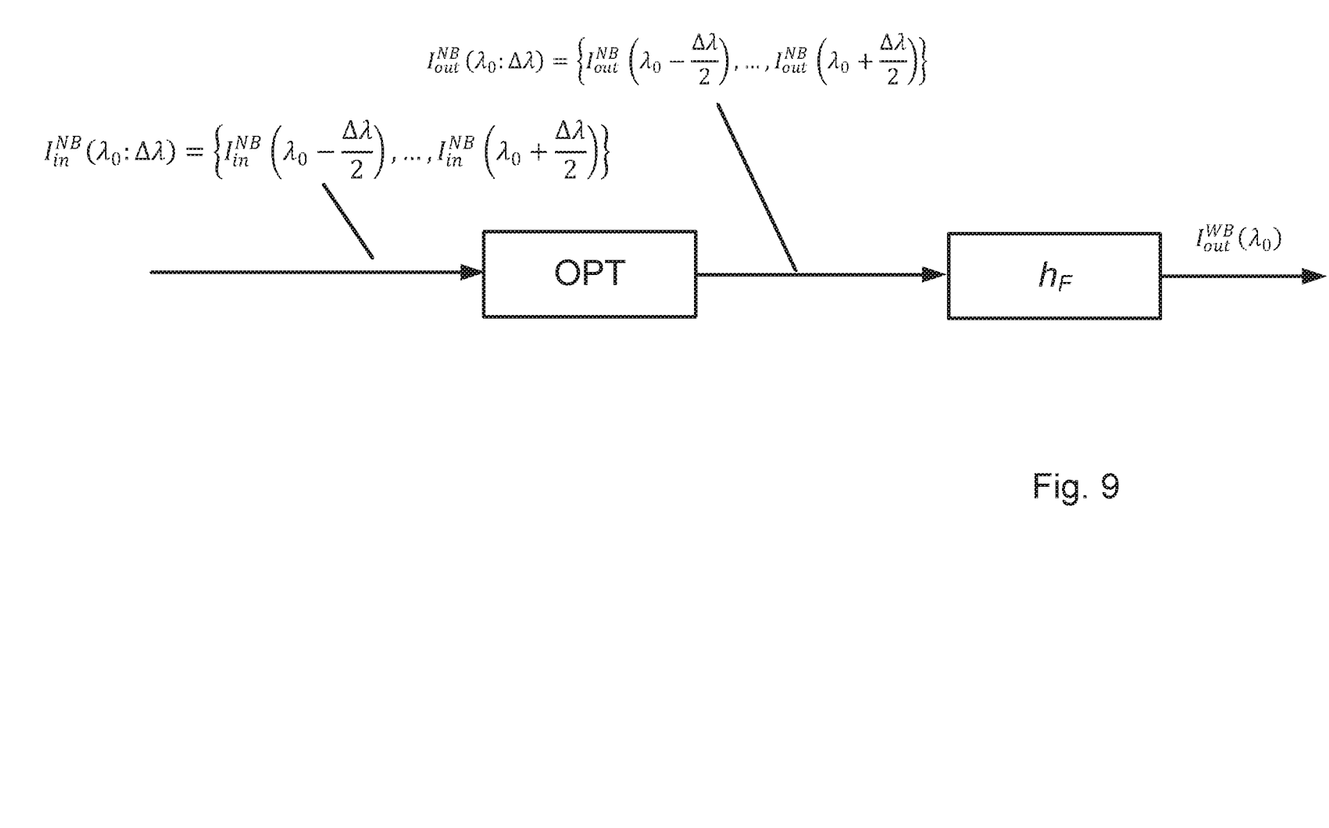
FIG. 9 conceptually illustrates a modelled system according to an exemplary embodiment of the invention.

FIG. 9 conceptually illustrates the modelled system according to an exemplary embodiment. The proposed methodology relies on the assumption that a wideband output (e.g., intensity) signal $I_{out}^{WB}$ can be modelled as a linear combination of narrowband signals $I_{out}^{NB}$, these being an estimate of the output of a metrology apparatus optical system OPT to narrowband input signals $I_{in}^{NB}$ (measurement radiation):

$$I_{out}^{WB}(\lambda_0) = \int_{\lambda_0 - \frac{\Delta\lambda}{2}}^{\lambda_0 + \frac{\Delta\lambda}{2}} I_{out}^{NB}(\lambda) h_F(\lambda; \lambda_0) d\lambda \quad \text{(Equation 2)}$$

where $\lambda_0$ denotes the central wavelength of the wideband signal having a bandwidth $\Delta\lambda$ and $h_F(\lambda; \lambda_0)$ denotes a filter response or transfer function relating the narrowband signal $I_{out}^{NB}(\lambda)$ to the wideband signal $I_{out}^{WB}(\lambda_0)$ for a given central wavelength $\lambda_0$. If it is assumed that the filter response $h_F(\lambda; \lambda_0)$ is the same for each central wavelength $\lambda_0$; i.e., it is invariant to central wavelength, then filter response $h_F(\lambda; \lambda_0)$ can be considered to be a shifted version of basis function $h_F(\lambda)$ centered at $\lambda_0=0$, which is defined in the interval $$\left[-\frac{\Delta\lambda}{2}, +\frac{\Delta\lambda}{2}\right]; \text{i.e.,} \ h_F(\lambda; \lambda_0) = h_F(\lambda - \lambda_0).$$

Therefore:

$$I_{out}^{WB}(\lambda_0) = \int_{-\infty}^{+\infty} I_{out}^{NB}(\lambda) h_F(\lambda - \lambda_0) d\lambda \quad \text{(Equation 3)}$$
$$= (I_{out}^{NB} * h_F)(\lambda_0)$$

where * denotes a convolution operation. From Equation 3 it can be observed that the relationship between narrowband signals and wideband signals can be modelled as a linear wavelength invariant (LWI) system. It should be noted that this LWI assumption might not hold for the complete wavelength range; however it can be assumed to be valid for a specific range of wavelengths.

As the relationship between the wideband signals $I_{out}^{WB}(\lambda_0, \Delta\lambda)$ actually measured and narrowband signals $I_{out}^{NB}(\lambda_0, \Delta\lambda)$ can be modelled by convolution, then the signals of interest $$I_{out}^{NB}(\lambda_0, \Delta\lambda) = \left\{I_{out}^{NB}\left(\lambda_0 - \frac{\Delta\lambda}{2}\right), \ldots, I_{out}^{NB}\left(\lambda_0 + \frac{\Delta\lambda}{2}\right)\right\}$$

can be estimated from a measured set of wideband signals $I_{out}^{WB}(\lambda_0, \Delta\lambda)$ via a deconvolution process using the filter response $h_F$.

In an embodiment, this deconvolution may be performed iteratively. This may be preferred because the system is underdetermined, and an iterative method avoids amplifying noise which might otherwise occur with a simple direct deconvolution. The iterative procedure may comprise converging on a solution for the narrowband signals of interest $\hat{I}_{out}^{NB}$ using:

$$\hat{I}_{out}^{NB}(\lambda_0,\Delta\lambda)_{k+1} = \hat{I}_{out}^{NB}(\lambda_0,\Delta\lambda)_k + \alpha(I_{out}^{WB}(\lambda_0,\Delta\lambda) - \hat{I}_{out}^{NB}(\lambda_0,\Delta\lambda)_k * h_F)$$ (Equation 4)

where $\alpha$ is a tunable parameter which determines the speed of convergence, the subscript k denotes the iteration step and $\hat{I}_{out}^{NB}$ is an estimation of (unknown) responses of the optics system to narrow band input signals in the bandwidth $$\left(\frac{\Delta\lambda}{2} - \lambda_0, \frac{\Delta\lambda}{2} + \lambda_0\right).$$

To estimate the responses of the optical system to narrow band signals, multiple wideband measurements of the target are made, each shifted in terms of central wavelength within the bandwidth; i.e.:

$$I_{out}^{WB}(\lambda_0, \Delta\lambda) = \left\{ I_{out}^{WB}\left(\lambda_0 - \frac{\Delta\lambda}{2}\right), \ldots, I_{out}^{WB}\left(\lambda_0 + \frac{\Delta\lambda}{2}\right) \right\}$$ (Equation 5)

The filter response $h_F$ may be known, or else the deconvolution may be performed blind based on an initial guess. The algorithm of Equation 4 begins with an initial estimate/guess of $\hat{I}_{out}^{NB}$ and continues to iterate on $\hat{I}_{out}^{NB}$ until convergence on a final estimate (solution) for the narrow-band signals. As the algorithm converges, the second convolution term on the right hand side of Equation 4 will approach zero such that the new estimate $\hat{I}_{out}^{NB}(\lambda_0,\Delta\lambda)_{k+1}$ on the present iteration k+1 becomes very close to the estimate $\hat{I}_{out}^{NB}(\lambda_0,\Delta\lambda)_k$ of the previous iteration k.

Figure 10:
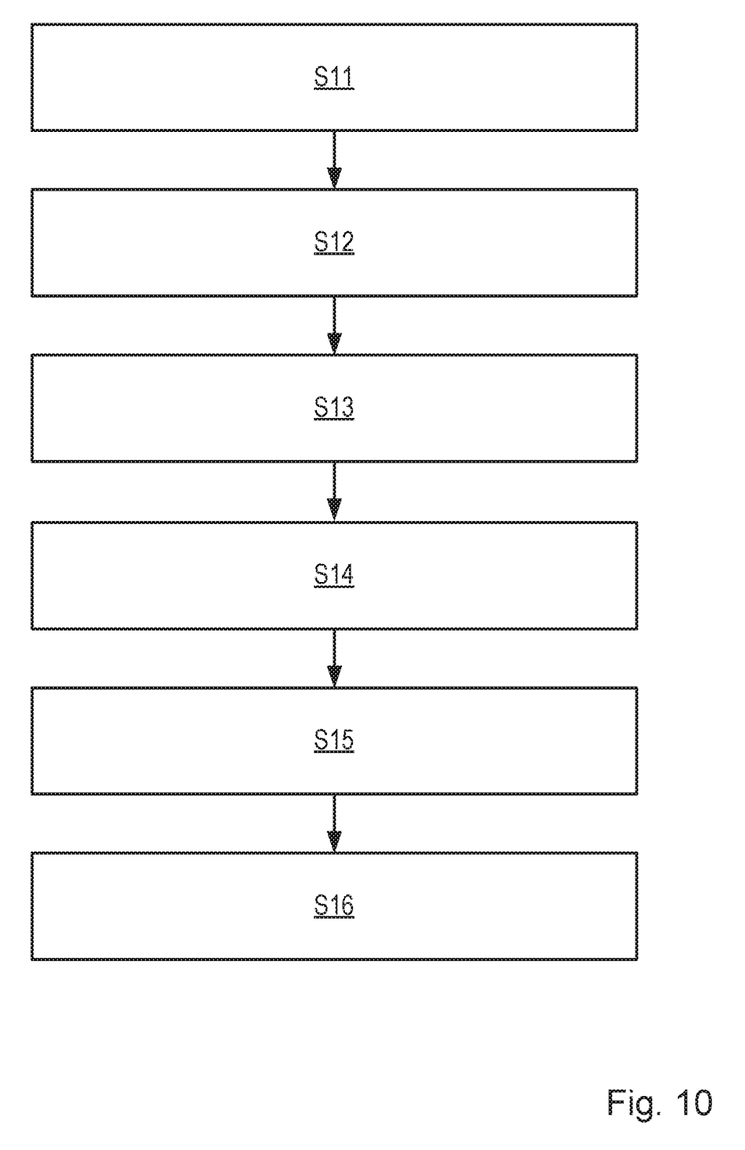
FIG. 10 is a flowchart describing a method of determining a performance parameter such as overlay according to an embodiment of the invention.

FIG. 10 is a flowchart of an exemplary method of measuring overlay using the techniques described herein. It should be noted however, that the invention is not limited to measurement of overlay and may be utilized for measurement of other (e.g., performance) parameters depending on the form of the target and/or determinations made. Such parameters may include focus and/or dose or critical dimension, side wall angle or other structural dimensional parameter.

At step S11, the substrate, for example a semiconductor wafer, is processed through a lithographic apparatus, such as the lithographic cell of FIG. 2, one or more times, to create an overlay target (e.g., a thick stack overlay target). At S12, using the metrology apparatus of e.g., FIG. 3, a set of first (normal) images of the overlay targets is obtained using measurement radiation which comprises only one of the first/higher order diffracted beams (e.g., +1). Due to limitations of the metrology apparatus (for example), the measurement radiation will be wideband for each image obtained, having a finite bandwidth as described. At step S13, a corresponding set of second (complementary) images of the overlay targets using second radiation which comprises the other first/higher order diffracted beam (e.g., -1) is obtained. Each of the first and second images are obtained with the central wavelength (i.e., its nominal wavelength) of the wideband measurement radiation having been shifted to a different value. The range of wavelengths over which the central wavelength is shifted over may be defined by (or be close to) the bandwidth $\Delta\lambda$ of the measurement radiation around the nominal central wavelength $\lambda_0$. Steps S12 and S13 may be performed simultaneously (e.g., by using optical wedges to separate the diffracted orders).

At step S14, an estimation of the responses of the optical system to narrow band input signals corresponding to wideband measurement signals is made. This may be done iteratively using the algorithm described by Equation 4 and a filter response relating the wideband measurement values (e.g., intensity values obtained from the images of steps S12 and S13) to narrowband signals output from the optical system. The filter response may be a known (e.g., previously modelled) filter response, or else the deconvolution step may be performed blind. The output of this step may be a set of estimated narrowband measurement values (e.g., intensity measurements) corresponding to the set of wideband measurement values actually measured. The spread of narrowband signals may correspond to the spread of the central wavelengths of the wideband measurements, with resolution being dependent on the number of wideband measurements made and their bandwidth/measurement range. Theoretically, the narrowband measurements may be estimated to correspond to any (narrower) bandwidth, from wideband measurements corresponding to any bandwidth. The only limitations result from the shifting of the center of the wideband measurements, and consistency of the filter response for a specific wavelength range. At least one pair (complementary and normal) of these estimated narrowband signals (e.g., narrowband intensity values) may be selected for overlay determination at step S16.

At step S15, The above steps S12 to S14 may be repeated one or more times on the same target for other selected central wavelengths. The selected central wavelengths in each case may be chosen to coincide with a peak (or anywhere else above the threshold) on a simulated swing curve such as swing curve 80 of FIG. 8. It should be noted that it is not necessarily the case that swing curve maxima correspond to preferred measurement wavelengths.

At step S16, the overlay (or other parameter) is determined using at least one pair of estimated narrowband measurement values from each set of estimated narrowband measurement values.

In summary, the methods above describe signal extraction and deconvolution techniques which are able to accurately estimate narrowband mean intensities using only the measured wideband mean intensities, thereby improving accuracy and reliability of measurements of thick stack targets using current metrology apparatuses which produce measurement radiation having a finite bandwidth.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps S14-S16 and so calculate overlay.

The program may optionally be arranged to control the optical system, substrate support and the like to perform the steps S12-S13 for measurement of asymmetry on a suitable plurality of targets.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the present invention are further described in below numbered clauses:

1. A method of determining a performance parameter of a target on a substrate comprising:
   estimating a set of narrowband measurement values from a set of wideband measurement values relating to the target; and
   determining said performance parameter from said set of narrowband measurement values.

2. A method according to clause 1, wherein said wideband measurement values relate to a plurality of measurements of the target performed using wideband measurement radiation, at least some of said plurality of measurements corresponding to wideband measurement radiation having different central wavelengths.

3. A method according to clause 2, wherein the bandwidth of said wideband measurement radiation comprises a bandwidth of the measurement radiation produced by a measurement apparatus used to perform the plurality of measurements of the target.

4. A method according to clause 2 or 3, comprising the initial step of performing the plurality of measurements of the target using said wideband measurement radiation; said plurality of measurements comprising measurements performed with measurement radiation of a different central wavelength, to obtain said a set of wideband measurement values.

5. A method according to any preceding clause, wherein said narrowband measurement values comprising an estimate of the measurement values which would be obtained from measurement of the target using narrowband measurement radiation having a bandwidth narrower than said wideband measurement radiation.

6. A method according to any preceding clause, wherein said estimating step comprises modeling said set of wideband measurement values as a linear combination of said set of narrowband measurement values.

7. A method according to any preceding clause, wherein said estimating step further comprises estimating the set of narrowband measurement values based on a transfer function relating said wideband measurement values to said narrowband measurement values.

8. A method according to clause 7, wherein said estimating step is performed iteratively.

9. A method according to clause 8, wherein said estimating step comprises iteratively minimizing a residual between the wideband measurement values and a convolution of an estimate of the set of narrowband measurement values in the previous iteration with the transfer function.

10. A method according to clause 9, wherein said estimating step comprises on each iteration, determining the sum of the residual, weighted by a convergence parameter, and the estimate of the set of narrowband measurement values in the previous iteration, until convergence on a final estimate.

11. A method according to any preceding clause, wherein said performance parameter comprises overlay.

12. A method according to any preceding clause, wherein said target has a thickness in a direction perpendicular to a plane of the substrate which is greater than 1 µm.

13. A metrology apparatus comprising:
   an illumination system configured to illuminate a target with wideband measurement radiation;
   a detection system configured to detect scattered radiation arising from illumination of the target; and
   a processor operable to:
   control said illumination system and detection system to perform a plurality of measurements of the target using the wideband measurement radiation to obtain a set of wideband measurement values relating to the target;
   estimate a set of narrowband measurement values from said wideband measurement values; and
   determine said performance parameter from said set of narrowband measurement values.

14. A metrology apparatus according to clause 13 at least some of said plurality of measurements are performed with measurement radiation of a different central wavelength.

15. A metrology apparatus according to clause 13 or 14, wherein said narrowband measurement values comprise an estimate of the measurement values which would be obtained from measurement of the target using narrowband measurement radiation having a bandwidth narrower than said wideband measurement radiation.

16. A metrology apparatus according to any of clauses 13 to 15, wherein said illumination system is incapable of producing measurement radiation with a bandwidth narrower than 10 nm.

17. A metrology apparatus according to any of clauses 13 to 15, wherein said illumination system is incapable of producing measurement radiation with a bandwidth narrower than 5 nm.

18. A metrology apparatus according to any of clauses 13 to 17, wherein the processor is configured to model said set of wideband measurement values as a linear combination of said set of narrowband measurement values.

19. A metrology apparatus according to any of clauses 13 to 18, wherein the processor is configured to estimate the set of narrowband measurement values based on a transfer function relating said wideband measurement values to said narrowband measurement values.

20. A metrology apparatus according to clause 19, wherein the processor is configured to estimate the set of narrowband measurement values from said wideband measurement values iteratively.

21. A metrology apparatus according to clause 20, wherein the processor is configured to iteratively minimize a residual between the wideband measurement values and a convolution of an estimate of the set of narrowband measurement values in the previous iteration with the transfer function.

22. A metrology apparatus according to clause 21, wherein the processor is configured to, on each iteration, determine the sum of the residual, weighted by a convergence parameter, and the estimate of the set of narrowband measurement values in the previous iteration, until convergence on a final estimate.

23. A metrology apparatus according to any of clauses 13 to 22, wherein said performance parameter comprises overlay.

24. A computer program comprising processor readable instructions which, when run on suitable processor controlled apparatus, cause the processor controlled apparatus to perform the method of any one of clauses 1 to 12.

25. A computer program carrier comprising the computer program of clause 24.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a performance parameter of a target on a substrate comprising:

measuring, using a metrology apparatus, a set of wideband measurement values of a target on a substrate;

estimating a set of narrowband measurement values from the set of measured wideband measurement values relating to the target; and determining the performance parameter from the set of narrowband measurement values.

2. The method of claim 1, wherein the wideband measurement values relate to a plurality of measurements of the target performed using wideband measurement radiation, at least some of the plurality of measurements corresponding to the wideband measurement radiation having different central wavelengths.

3. The method of claim 2, wherein the bandwidth of the wideband measurement radiation comprises a bandwidth of the measurement radiation produced by the metrology apparatus used to perform the plurality of measurements of the target.

4. The method of claim 2, further comprising:

performing the plurality of measurements of the target using the wideband measurement radiation wherein the plurality of measurements comprises measurements performed with measurement radiation of a different central wavelength to measure the set of wideband measurement values.

5. The method of claim 1, wherein the narrowband measurement values comprising an estimate of the measurement values which would be obtained from measurement of the target using narrowband measurement radiation having a bandwidth narrower than the wideband measurement radiation.

6. The method of claim 1, wherein the estimating comprises modeling the set of measured wideband measurement values as a linear combination of the set of narrowband measurement values.

7. The method of claim 1, wherein the estimating further comprises estimating the set of narrowband measurement values based on a transfer function relating the wideband measurement values to the narrowband measurement values.

8. The method of claim 7, wherein the estimating is performed iteratively.

9. The method of claim 8, wherein the estimating comprises iteratively minimizing a residual between the wideband measurement values and a convolution of an estimate of the set of narrowband measurement values in the previous iteration with the transfer function.

10. A method of claim 9, wherein the estimating comprises, on each iteration, determining the sum of the residual, weighted by a convergence parameter, and the estimate of the set of narrowband measurement values in the previous iteration, until convergence on a final estimate.

11. The method of claim 1, wherein the performance parameter comprises overlay.

12. The method of claim 1, wherein the target has a thickness in a direction perpendicular to a plane of the substrate which is greater than about 1 μm.

* * * * *

UNITED STATES PATENT AND TRADEMARK OFFICE
CERTIFICATE OF CORRECTION

PATENT NO. : 10,794,693 B2  
APPLICATION NO. : 16/102145  
DATED : October 6, 2020  
INVENTOR(S) : Farhadzadeh et al.

Page 1 of 1

It is certified that error appears in the above-identified patent and that said Letters Patent is hereby corrected as shown below:

On the Title Page

On page 2, item (56), replace ", Metrology," with --Metrology,--.

In the Claims

In Column 18, Line 2, replace "a target on a substrate" with --a target on the substrate--.

In Column 18, Lines 14-16, replace "wherein the bandwidth of the wideband measurement radiation comprises a bandwidth of the measurement radiation" with --wherein a bandwidth of the wideband measurement radiation comprises a bandwidth of the wideband measurement radiation--.

In Column 18, Line 21, replace "using the wideband measurement radiation wherein" with --using the wideband measurement radiation, wherein--.

In Column 18, Line 27, replace "values comprising an estimate" with --values comprise an estimate--.

In Column 18, Lines 47-48, replace "A method of claim 9, wherein the estimating comprises, on each iteration, determining the sum" with --The method of claim 9, wherein the estimating comprises, on each iteration, determining a sum--.

Signed and Sealed this  
Eighth Day of December, 2020

Andrei Iancu  
*Director of the United States Patent and Trademark Office*